United States Patent [19]
Kidoguchi et al.

[11] Patent Number: 6,118,800
[45] Date of Patent: Sep. 12, 2000

[54] SEMICONDUCTOR LASER AND CLEAVING METHOD

[75] Inventors: Isao Kidoguchi, Kawanishi; Hideto Adachi, Ibaraki; Yasuhito Kumabuchi, Toyonaka, all of Japan

[73] Assignee: Matsushita Electric Industrial Co., Ltd., Osaka, Japan

[21] Appl. No.: 08/945,770

[22] PCT Filed: Feb. 28, 1997

[86] PCT No.: PCT/JP97/00618

§ 371 Date: Dec. 19, 1997

§ 102(e) Date: Dec. 19, 1997

[87] PCT Pub. No.: WO97/32376

PCT Pub. Date: Sep. 4, 1997

[30] Foreign Application Priority Data

Mar. 1, 1996 [JP] Japan ................................. 8-044494

[51] Int. Cl.[7] ........................................................ H01S 3/19
[52] U.S. Cl. ................................................ 372/46; 372/45
[58] Field of Search .......................................... 372/45, 46

[56] References Cited

U.S. PATENT DOCUMENTS

| | | | |
|---|---|---|---|
| 5,608,752 | 3/1997 | Goto et al. | 372/46 |
| 6,014,394 | 1/2000 | Tomita | 372/45 |

FOREIGN PATENT DOCUMENTS

| | | |
|---|---|---|
| 58-159349 | 9/1983 | Japan . |
| 63-202083 | 8/1988 | Japan . |
| 6-260716 | 9/1994 | Japan . |
| 7-15080 | 1/1995 | Japan . |
| 7-302951 | 11/1995 | Japan . |
| 8-18160 | 1/1996 | Japan . |
| 8-316563 | 11/1996 | Japan . |
| 9-83064 | 3/1997 | Japan . |
| 9-205253 | 8/1997 | Japan . |
| 9-214058 | 8/1997 | Japan . |

OTHER PUBLICATIONS

International Search Report dated Jul. 4, 1997.
H. Adachi et al., "Self–Sustained Pulsation in 650–nm–Band AlGaInP Visible–Laser Diodes with Highly Doped Saturable Absorbing Layer", IEEE Photonics Technology Letters, vol. 7, No. 12, 3 pages and cover, Dec. 1995.
R. C. P. Hoskens et al., "Self–pulsating lasers with quantum well saturable absorber", American Institute of Physics, Appl. Phys. Lett. 67 (10), pp. 1343–1345, Sep. 4, 1995.

*Primary Examiner*—James W. Davie
*Attorney, Agent, or Firm*—Ratner & Prestia

[57] ABSTRACT

In a semiconductor laser having an active layer and a cladding structure interposing the active layer, the cladding structure includes a saturable absorbing layer, and the saturable absorbing layer is formed of InGaAsP.

25 Claims, 16 Drawing Sheets

- 113 p electrode
- 112 Cap layer
- 110 Contact layer
- 111 Current blocking layer
- 105b Second p-type cladding layer
- 106 Saturable absorbing layer
- 105a First p-type cladding layer
- 104 Active layer
- 103 n-type cladding layer
- 102 Buffer layer
- 101 Substrate
- 114 n electrode

SEMICONDUCTOR LASER AND CLEAVING METHOD

THIS APPLICATION IS A U.S. NATIONAL PHASE APPLICATION OF PCT INTERNATIONAL APPLICATION PCT/JP97/00618.

TECHNICAL FIELD

The present invention relates to a low-noise semiconductor laser used as a light source of an optical disk system, or the like.

BACKGROUND ART

In recent years, the demand for semiconductor lasers has been increasing in the field of optical communication, laser printers, optical disks, and the like, and research and development therefor have mainly been actively conducted for those of the GaAs and InP types. In the field of optical information processing, a system for recording/reproducing information using, particularly, AlGaAs type semiconductor laser light having a wavelength of about 780 nm has been put to practical use, and widely used for compact disks, and the like.

When reproducing an optical disk by using a semiconductor laser as a light source, an intensity noise is generated due to feedback of reflected light from a disk surface or due to temperature variation. Such an intensity noise induces a signal read error. Therefore, a semiconductor laser with a low intensity noise is essential as a light source for optical disks.

Conventionally, in an AlGaAs type semiconductor laser with a low output which is used as a light source for a read-only optical disk, noise reduction has been attempted by employing a structure where a saturable absorber is intentionally formed on each side of a ridge stripe to reduce noise. By employing such a structure, multiple longitudinal modes are realized. If a disturbance due an optical feedback, temperature variation, or the like, is introduced while a semiconductor laser is oscillating in a single longitudinal mode, adjacent longitudinal modes start oscillating due to a slight change in the gain peak. Those modes which start oscillating as described above will conflict with the original oscillation mode, thus presenting a cause of a noise. On the other hand, when multiple longitudinal modes are realized in such a way as described above, intensity variation between different modes is averaged, while the intensity variation due to a disturbance will not be generated, whereby it is possible to obtain a stable low-noise characteristic.

Moreover, as an alternative method, an attempt to obtain a more stable self-sustained pulsation characteristic is shown in Japanese Laid-open Publication No. 63-202083. Specifically, a self-sustained pulsation type semiconductor laser is realized by providing a layer which can absorb output light.

Furthermore, Japanese Laid-open Publication No. 6-260716 reports that an operating characteristic of a semiconductor laser was improved by making the bandgap of an active layer and the bandgap of an absorbing layer substantially equal to each other. The publication refers particularly to a red semiconductor laser as an example.

FIG. 16 is a cross-sectional view schematically showing the structure of the self-sustained pulsation type semiconductor laser disclosed in the above Japanese Laid-open Publication No. 6-260716.

Specifically, an n-type GaInP buffer layer 1302 and an n-type AlGaInP cladding layer 1303 are formed on an n-type GaAs substrate 1301, and a GaInP strained quantum well (MQW) active layer 1304 is formed in the cladding layer 1303. A strained quantum well saturable absorbing layer 1305 is further formed in the cladding layer 1303. A cladding layer 1306 and a p-type GaInP contact layer 1307 are formed into a ridge-like shape above the cladding layer 1303. Both sides of the ridge formed of the cladding layer 1306 and the contact layer 1307 are buried with an n-type GaAs current blocking layer 1308. Moreover, a p-type GaAs cap layer 1309 is formed on the contact layer 1307 and the current blocking layer 1308, a p-electrode 1310 is formed on the cap layer 1309 and, on the other hand, an n-electrode 1311 is formed on the reverse surface of the substrate 1301.

The above Japanese Laid-open Publication No. 6-260716 attempts to obtain a good self-sustained pulsation characteristic by the structure as described above.

DISCLOSURE OF THE INVENTION

According to one aspect of the present invention, a semiconductor laser includes an active layer and a cladding structure interposing the active layer, the cladding structure including a saturable absorbing layer, and the saturable absorbing layer being formed of $In_xGa_{1-x}As_yP_{1-y}$ ($0<x<1$, $0 \leq y \leq 1$).

Preferably, an interval between the saturable absorbing layer and the active layer is about 200 angstroms or more.

In one embodiment, the cladding structure further includes a light guide layer, and the saturable absorbing layer is adjacent to the light guide layer. Alternatively, the cladding structure further includes a light guide layer, and the saturable absorbing layer is located in a vicinity of the light guide layer.

In one embodiment, the saturable absorbing layer has a strained quantum well structure, and an energy gap between ground states of the saturable absorbing layer is smaller than an energy gap of the active layer by about 30 meV to about 200 meV.

Preferably, the active layer and the cladding structure excluding the saturable absorbing layer are formed of $(Al_xGa_{1-x})_yIn_{1-y}P$.

According to another aspect of the present invention, a semiconductor laser includes an active layer and a cladding structure interposing the active layer, the cladding structure including a saturable absorbing layer, the saturable absorbing layer being formed of InGaAsP, and the saturable absorbing layer having a strained quantum well structure.

Preferably, an interval between the saturable absorbing layer and the active layer is about 200 angstroms or more.

In one embodiment, the cladding structure further includes a light guide layer, and the saturable absorbing layer is adjacent to the light guide layer. Alternatively, the cladding structure further includes a light guide layer, and the saturable absorbing layer is located in a vicinity of the light guide layer.

In one embodiment, an energy gap between ground states of the saturable absorbing layer is smaller than an energy gap of the active layer by about 30 meV to about 200 meV.

Preferably, the active layer and the cladding structure excluding the saturable absorbing layer are formed of $(Al_xGa_{1-x})_yIn_{1-y}P$.

According to still another aspect of the present invention, a semiconductor laser includes an active layer and a cladding structure interposing the active layer, the cladding structure including a saturable absorbing layer, and the saturable absorbing layer being formed of InGaAs.

Preferably, an interval between the saturable absorbing layer and the active layer is about 200 angstroms or more.

In one embodiment, the cladding structure further includes a light guide layer, and the saturable absorbing layer is adjacent to the light guide layer. Alternatively, the cladding structure further includes a light guide layer, and the saturable absorbing layer is located in a vicinity of the light guide layer.

In one embodiment, an energy gap between ground states of the saturable absorbing layer is smaller than an energy gap of the active layer by about 30 meV to about 200 meV.

Preferably, the active layer and the cladding structure excluding the saturable absorbing layer are formed of $Al_zGa_{1-z}As$.

According to still another aspect of the present invention, a semiconductor laser includes an active layer and a cladding structure interposing the active layer, the cladding structure including a saturable absorbing layer, and a thickness of the saturable absorbing layer being about 100 angstroms or less.

Preferably, the thickness of the saturable absorbing layer is about 80 angstroms or less.

In one embodiment, the cladding structure further includes a light guide layer, and the saturable absorbing layer is adjacent to the light guide layer. Alternatively, the cladding structure further includes a light guide layer, and the saturable absorbing layer is located in a vicinity of the light guide layer.

In one embodiment, the saturable absorbing layer has a strained quantum well structure, and an energy gap between ground states of the saturable absorbing layer is smaller than an energy gap of the active layer by about 30 meV to about 200 meV.

According to still another aspect of the present invention, a semiconductor laser includes: an active layer; an n-type cladding layer and a first p-type cladding layer interposing the active layer; a current blocking layer formed on the first p-type cladding layer, the current blocking layer having an opening; and a second p-type cladding layer formed at the opening, the second p-type cladding layer including a saturable absorbing layer.

In one embodiment, the saturable absorbing laser is formed of InGaAsP or InGaAs.

In one embodiment, a mode control layer is formed in the current blocking layer.

Preferably, the first p-type cladding layer is formed of a material which has a bandgap larger than a bandgap of the n-type cladding layer. For example, the first p-type cladding layer is an AlGaInPN layer.

According to still another aspect of the present invention, a cleavage method is provided. The cleavage method is a method for cleaving a substrate having a surface orientation which is inclined to a predetermined direction with respect to a surface orientation of a just surface, and the substrate is cleft by applying a stress in the direction in which the surface orientation of the substrate is inclined.

Another cleavage method of the present invention is a method for cleaving a crystal having a surface orientation inclined from a [100] direction toward a [0- 1-1] direction, and the crystal is cleft by applying a stress in the [0-1-1] direction.

Thus, the present invention has the objectives of: (1) providing a semiconductor laser having a stable self-sustained pulsation characteristic and high reliability by selecting a particular material as a constituent material of a saturable absorbing layer included in the semiconductor laser; and (2) providing a cleavage method which may be used in a production process of such a semiconductor laser.

BEST MODE FOR CARRYING OUT THE INVENTION

Before describing particular embodiments of the present invention, results of a study made by the inventors of the present invention in the course of achieving the present invention will first be described below.

As described above, in conventional techniques, there are various reports regarding utilization of the self-sustained pulsation phenomenon in a semiconductor laser. However, the study by the inventors of the present invention has revealed that it is difficult to obtain the self-sustained pulsation characteristic with an AlGaInP type semiconductor laser because it considerably differs from those of the AlGaAs type in the gain characteristic curve of the material. This will be described with reference to FIG. 15.

Figure 15:
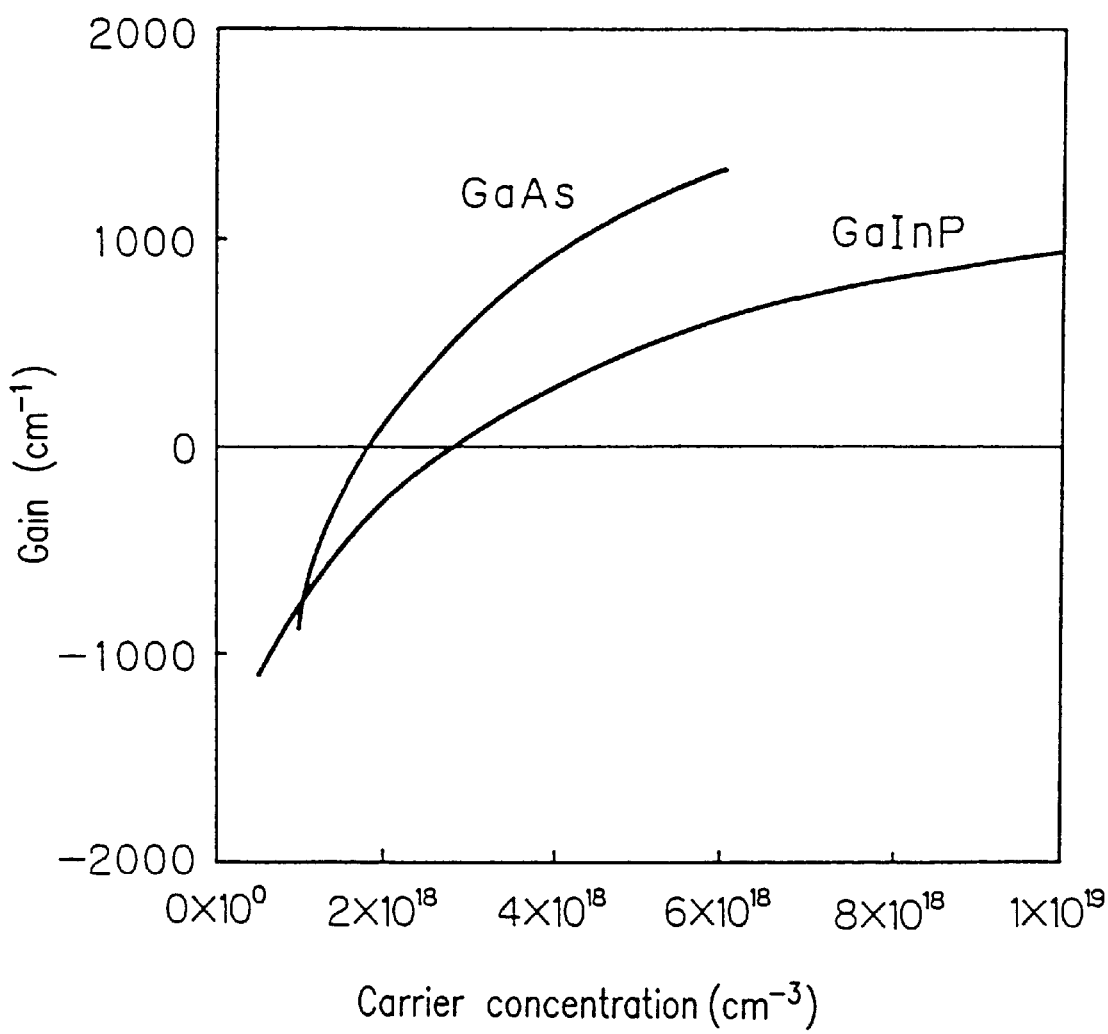
FIG. 15 is a diagram showing gain characteristic curves of GaAs and GaInP.
Figure 16:
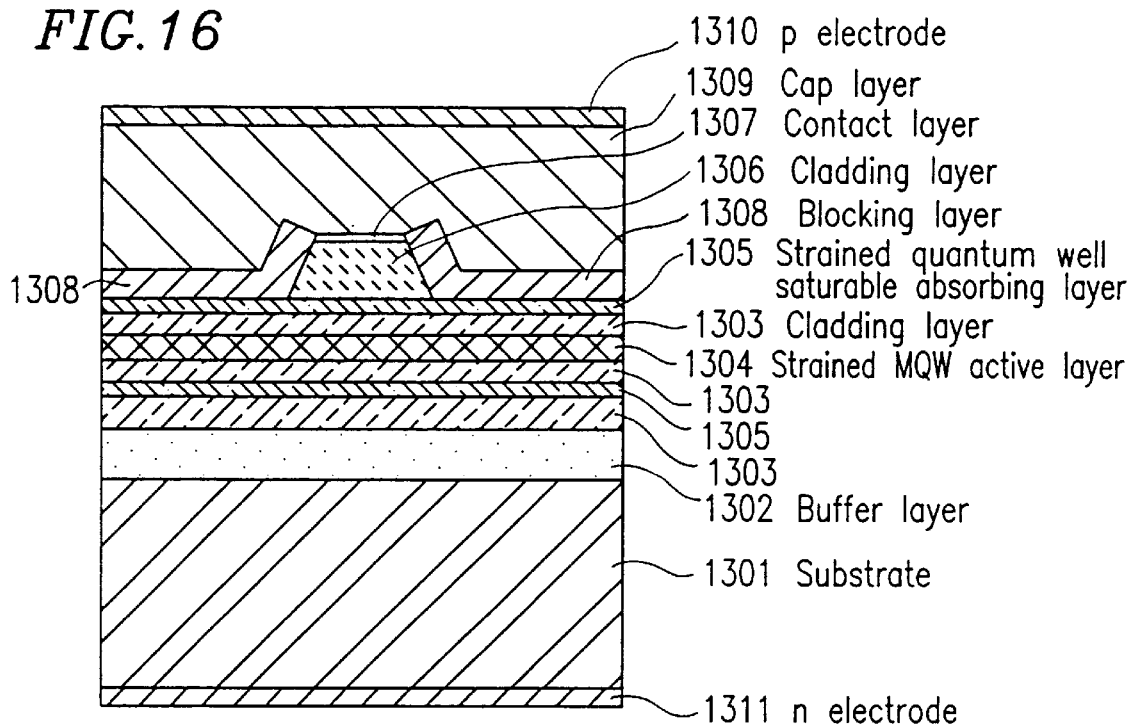
FIG. 16 is a cross-sectional view showing an example of a structure of a self-sustained pulsation type semiconductor laser according to a conventional technique.

FIG. 15 is a diagram showing gain characteristics of GaAs and GaInP. These materials (GaAs and GaInP) are mainly used as a constituent material of an active layer in an AlGaAs type semiconductor laser and an AlGaInP type semiconductor laser, respectively.

The study by the inventors of the present invention has revealed that the self-sustained pulsation characteristic can be obtained more easily as the gradient of the curve of the gain characteristic with respect to the carrier concentration becomes larger. The reason for this is associated with that fact that an intense oscillation of the carrier is required within the saturable absorbing layer in order to obtain the self-sustained pulsation characteristic. As the gradient of the curve of the gain characteristic with respect to the carrier concentration is larger, the carrier concentration can be varied by a smaller amount of light absorption and, as a result, the oscillation of the carrier can occur more easily.

However, it has been proven that it is relatively difficult to obtain the self-sustained pulsation characteristic in the case of GaInP since the gradient of the gain characteristic curve thereof is smaller than that of GaAs.

The results of the experiment conducted by the inventors of the present invention have revealed that, in the case of a red semiconductor laser, it is difficult to obtain a stable self-sustained pulsation characteristic by simply adding a saturable absorbing layer as done in the conventional techniques. Particularly, it is difficult to obtain a stable self-sustained pulsation characteristic at a high temperature. Moreover, in a structure such as those according to the conventional techniques, the amount of light consumed in the saturable absorbing layer is large and, as a result, there is a tendency for a threshold current to increase. Thus, the reliability may possibly be compromised at a high temperature, e.g., about 80° C.

Herein, other parameters relating to generation of the self-sustained pulsation in a semiconductor laser include the carrier concentration within the saturable absorbing layer. Particularly, one possible way is to sufficiently reduce the volume of the saturable absorbing layer so as to relatively increase the carrier concentration therein. In view of this, there is an optimal value for the deposition (i.e., the thickness) of the saturable absorbing layer, and thus a stable self-sustained pulsation characteristic cannot be obtained easily by simply adding the saturable absorbing layer.

Moreover, in order to achieve a stable self-sustained pulsation phenomenon, it is necessary to ensure an adequate light confinement into the saturable absorbing layer. Although one may simply think that it is sufficient to provide a saturable absorbing layer closer to the active layer in order to do so, when the distance therebetween is too short, there occurs an adverse influence on the operating characteristic due to an overflow of the minority carrier out of the active layer. Therefore, it is necessary to ensure about 200 angstroms or more, desirably about 500 angstroms or more, for the distance between the active layer and the saturable absorbing layer. Thus, it is necessary to ensure light confinement while also ensuring a sufficient distance between the active layer and the saturable absorbing layer, and it will consequently be difficult to obtain a semiconductor laser having a desired self-sustained pulsation characteristic unless these conditions are met at the same time.

While the above-described results of the study relate chiefly to a red semiconductor laser formed mainly by using an AlGaInP type material, it cannot be sufficiently realized with conventional techniques to ensure a stable self-sustained pulsation in a condition where the threshold current is low with respect to AlGaAs type materials having an oscillation wavelength in the infrared region. The problems become significant particularly when a higher output is desired.

Hereinafter, some of various embodiments of the present invention, which have been achieved based on the results of the study as described above, will be described with reference to the accompanying figures.

(Embodiment 1)

Figure 1A:
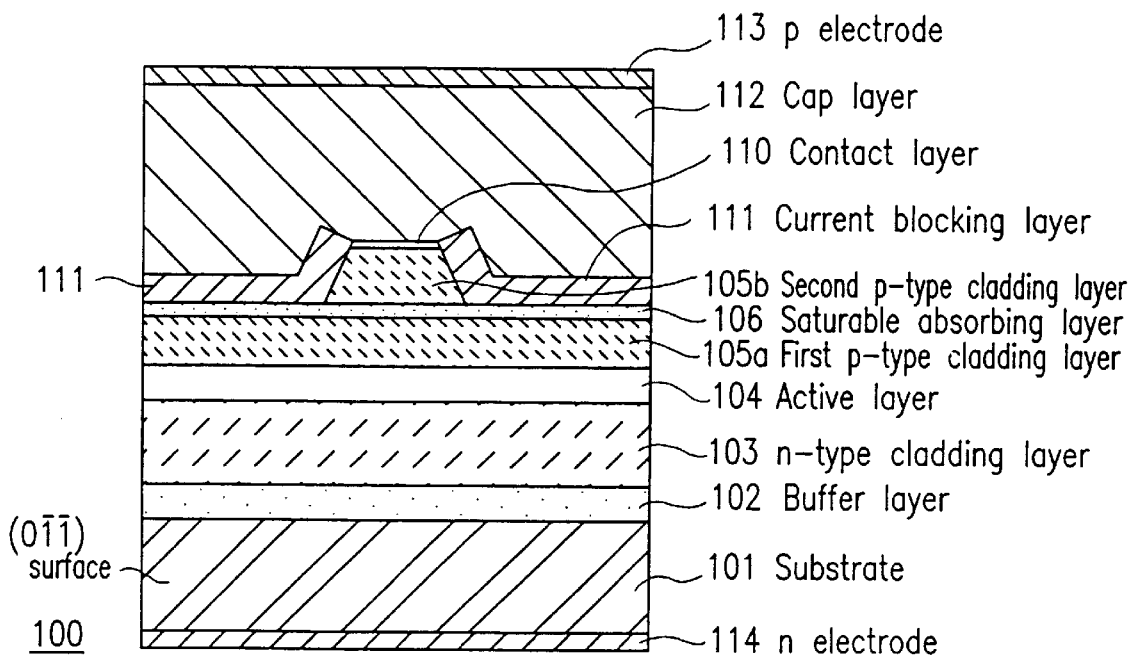
FIGS. 1A and 1B are a cross-sectional view and a perspective view, respectively, showing a structure of a semiconductor laser according to Embodiment 1 of the present invention.
Figure 1B:
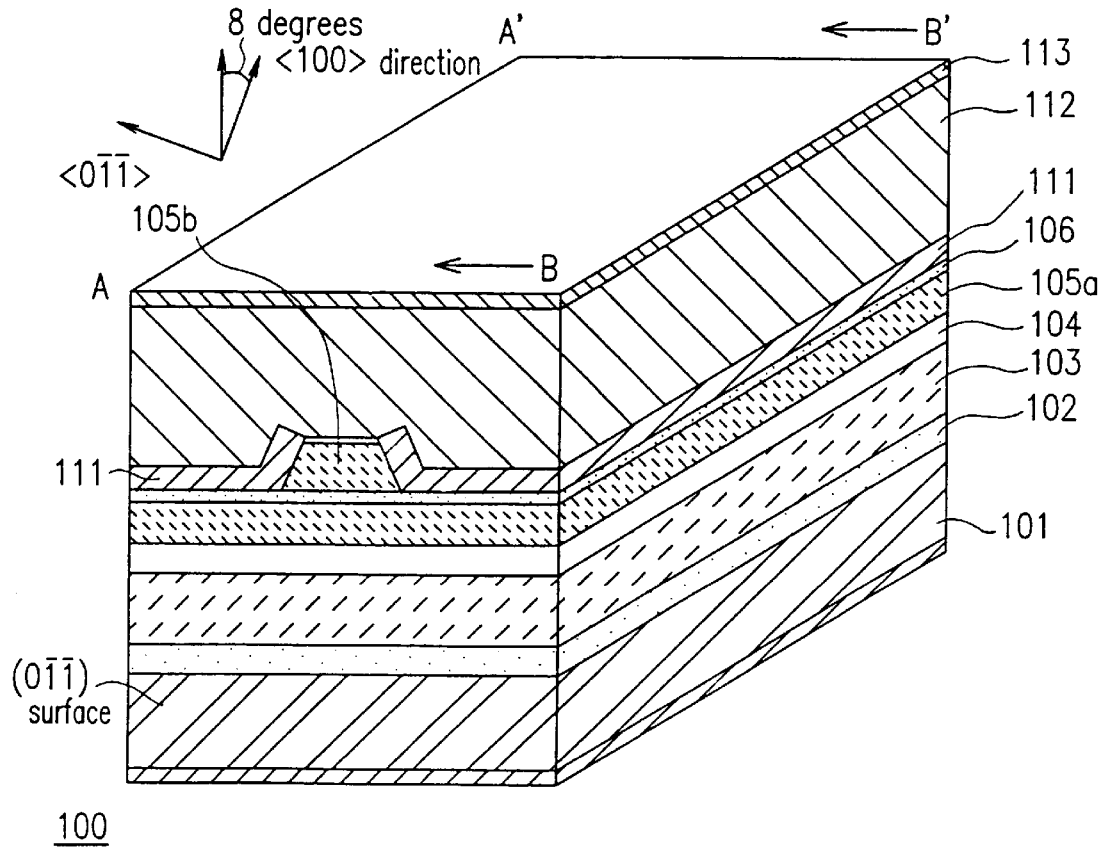

FIGS. 1A and 1B are a cross-sectional view and a perspective view, respectively, showing a structure of a semiconductor laser 100 having a self-sustained pulsation characteristic according to Embodiment 1 of the present invention.

In the semiconductor laser 100, a layered structure of a semiconductor material is formed on an n-type GaAs substrate 101. Particularly, the substrate 101 is inclined by about 8 degrees from the (100) surface toward the (0-1-1) direction. In this specification of the present application, the expression "−1" included in the representation of the surface orientation means the same as "$\bar{1}$" obtained by affixing a bar () on the top of the number "1". For example, the above expression "(0-1-1) direction" means "(0$\bar{1}\bar{1}$) direction".

An n-type GaAs buffer layer 102, an n-type AlGaInP cladding layer 103, a GaInP active layer 104, a first p-type cladding layer 105a of AlGaInP, and an InGaAsP saturable absorbing layer 106 are sequentially formed on the substrate 101. A second p-type cladding layer 105b of AlGaInP and a p-type GaInP contact layer 110 are formed on the saturable absorbing layer 106. The second p-type cladding layer 105b and the p-type contact layer 110 are formed into a ridge-like shape, and an n-type GaAs current blocking layer 111 is formed on both sides of the ridge. Moreover, a p-type GaAs cap layer 112 is formed on the p-type contact layer 110 and the n-type current blocking layer 111. Furthermore, a p-electrode 113 is formed on the cap layer 112 and, on the other hand, an n-electrode 114 is formed on the reverse surface of the substrate 101.

Typical thicknesses of the above layers are as follows.

TABLE 1

| Name | Reference numeral | Thickness |
|---|---|---|
| Cap layer | 112 | 3 µm |
| Contact layer | 110 | 500 Å |
| Second p-type cladding layer | 105b | 0.9 µm |
| Saturable absorbing layer | 106 | 60 Å |
| First p-type cladding layer | 105a | 0.2 µm |
| Active layer | 104 | 500 Å |
| N-type cladding layer | 103 | 1.0 µm |
| Buffer layer | 102 | 0.3 µm |

Figure 2:
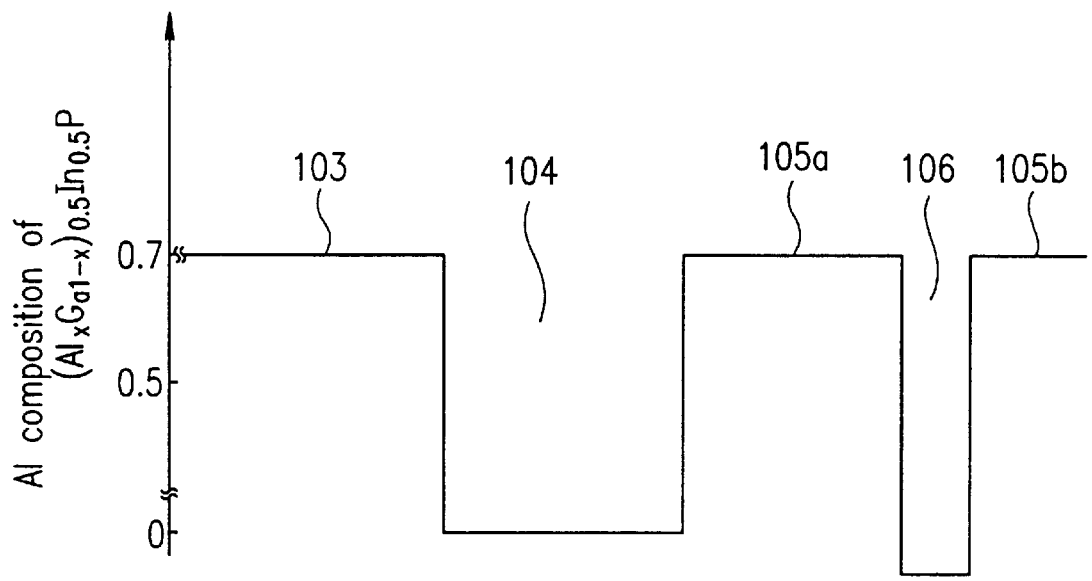
FIG. 2 is a diagram showing variation of an Al composition in, and in the vicinity of, an active layer of the semiconductor laser shown in FIGS. 1A and 1B.

FIG. 2 shows variation of the Al composition x of $(Al_xGa_{1-x})_{0.5}In_{0.5}P$ in, and in the vicinity of, the active layer 104 of the semiconductor laser 100. As illustrated, in the semiconductor laser 100, the Al compositions x in the n-type cladding layer 103, and in the first and second p-type cladding layers 105a and 105b, are set to 0.7.

Moreover, as shown in the above table, in the semiconductor laser 100, the thickness of the saturable absorbing layer 106 is set to about 60 Å. When the saturable absorbing layer 106 is thick, the volume thereof becomes too large, whereby it is difficult for the carrier concentration to be large. Therefore, it becomes difficult for the variation of the carrier concentration, i.e., an intense oscillation of the carrier, to occur within the saturable absorbing layer 106 and, as a result, it becomes difficult to obtain the self-sustained pulsation characteristic. Thus, it is desirable for the saturable absorbing layer to be thin.

The composition of the InGaAsP saturable absorbing layer 106 is, for example, $In_{0.5}Ga_{0.5}As_{0.1}P_{0.9}$. The lattice constant of InGaAsP having this composition is larger than the lattice constant of GaAs forming the substrate 101 and, as a result, a compressive stress is applied to the saturable absorbing layer 106. Thus, the saturable absorbing layer 106 of the semiconductor laser 100 has a strained quantum well structure.

Figure 3:
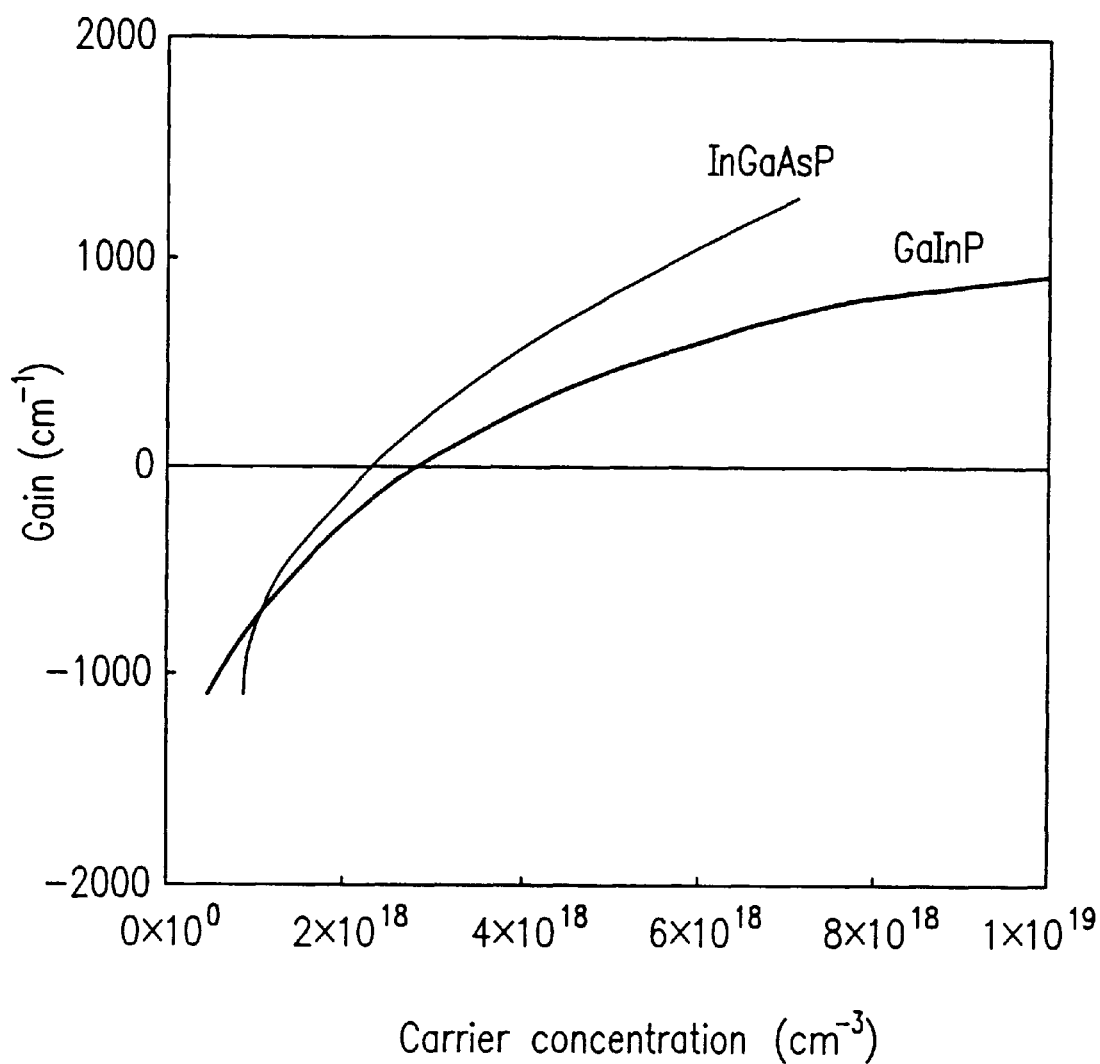
FIG. 3 is a diagram showing gain characteristic curves of GaInP and InGaAsP.

FIG. 3 shows the gain characteristics (relationship between the carrier concentration and the gain) of GaInP and InGaAsP. It can be seen that InGaAsP has a larger gradient of the gain characteristic curve.

The study made by the inventors of the present invention has revealed that, in a semiconductor laser having a saturable absorbing layer, the self-sustained pulsation characteristic can be obtained more easily as the gradient of the gain characteristic (the ratio of the variation of the gain with respect to the variation of the carrier concentration) of the material used for the saturable absorbing layer becomes larger. In other words, as the gradient of the gain characteristic curve becomes larger, it is more advantageous for the self-sustained pulsation. This can be explained as follows. In order to obtain the self-sustained pulsation characteristic, an intense oscillation of the carrier within the saturable absorbing layer is required. Herein, as the gradient of the gain characteristic curve becomes larger, the carrier concentration can be varied by a smaller amount of light absorption. As a result, as the gradient of the gain characteristic curve becomes larger, the oscillation of the carrier occurs more easily, and the self-sustained pulsation phenomenon occurs more easily.

Herein, the data shown in FIG. 3 has been obtained with respect to InGaAsP which is lattice-matched with the substrate. When a compressive stress is applied to InGaAsP (e.g., in the case of $In_{0.5}Ga_{0.5}As_{0.1}P_{0.9}$ formed on a GaAs substrate), the gradient of the gain characteristic curve becomes even larger than that shown in FIG. 3, and is more advantageous for realizing the self-sustained pulsation.

Figure 4:
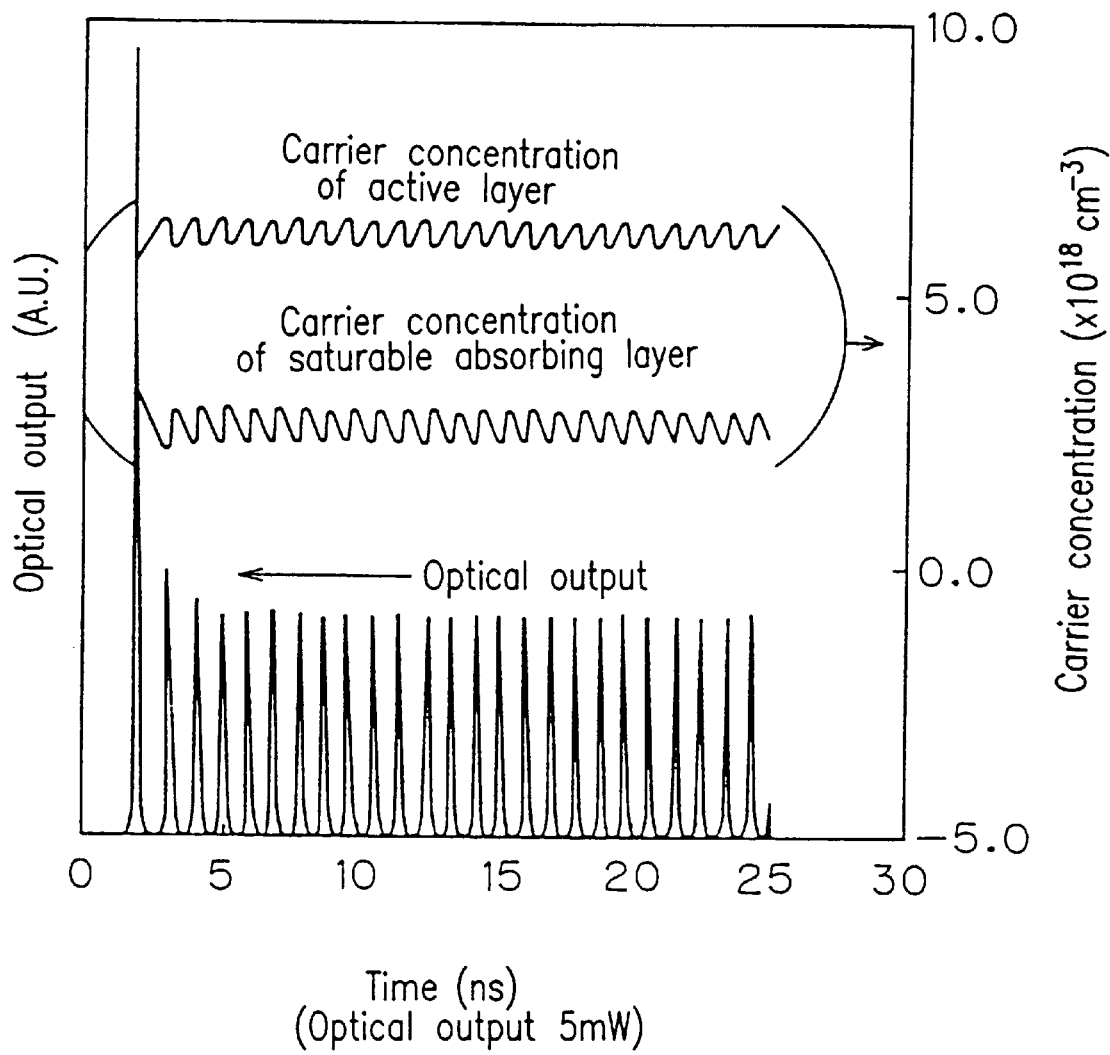
FIG. 4 is a diagram showing temporal variation of an optical output and a carrier concentration in the semiconductor laser shown in FIGS. 1A and 1B.

FIG. 4 shows simulation results of temporal variation of the optical output waveform in the case where the optical output is about 5 mW. The carrier concentration variation in the active layer and that in the saturable absorbing layer are also shown in the figure. From this, it is obvious that the oscillation phenomenon of the optical output is continuous.

Figure 5:
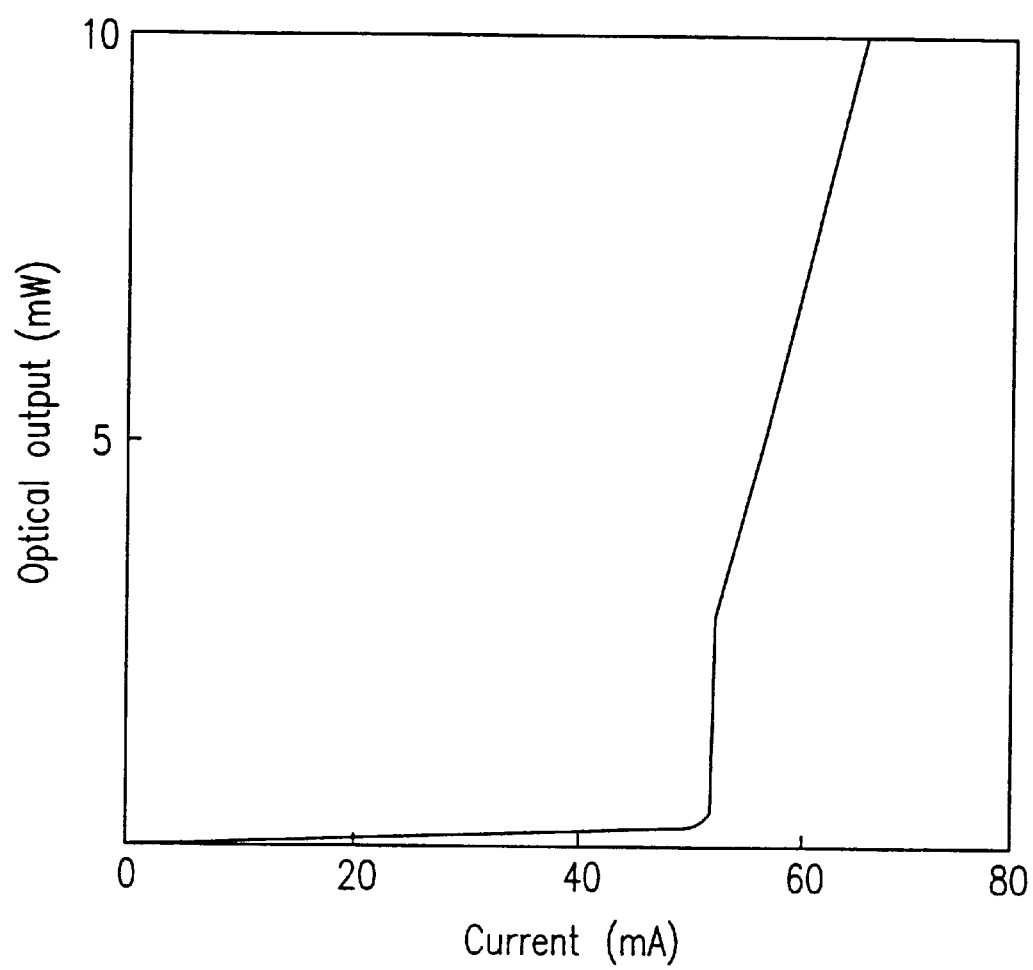
FIG. 5 is a diagram showing a relationship between an optical output and a current in the semiconductor laser shown in FIGS. 1A and 1B.

FIG. 5 is an example of a measurement of the current-optical output characteristic in the self-sustained pulsation type semiconductor laser 100 according to the present embodiment, and it can be seen that the threshold current is about 60 mA in this case. As indicated in FIG. 5, the current-optical output characteristic of the self-sustained pulsation type semiconductor laser differs from the characteristic of an ordinary semiconductor laser in that a sharp rise is observed in the characteristic curve in the vicinity of the threshold current. This is because the optical output is not released outside until a certain degree of carrier injection is reached, since there is a saturable absorbing layer in the self-sustained pulsation type semiconductor laser. When the amount of carrier injection exceeds a certain value, laser oscillation occurs, and the optical output increases in proportion to the amount of current injection.

Figure 6:
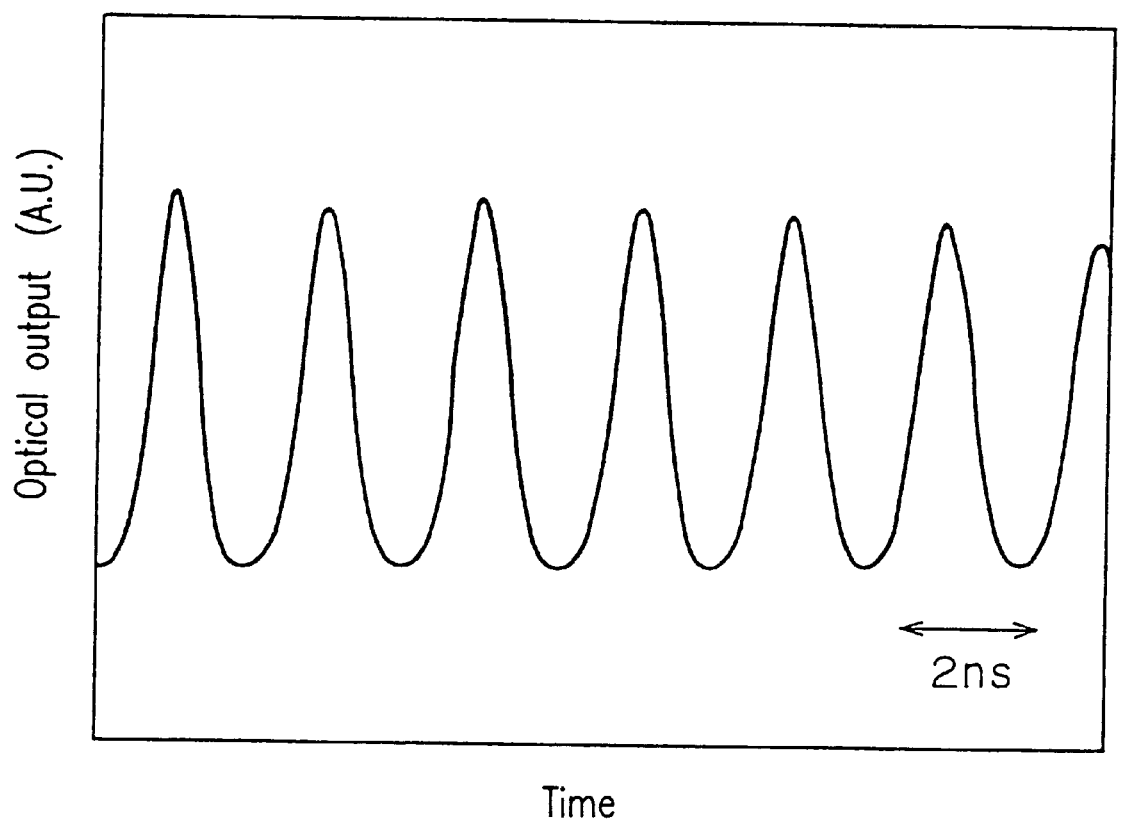
FIG. 6 is a diagram showing an example of an actually measured waveform of temporal variation of an optical output in the semiconductor laser shown in FIGS. 1A and 1B.

FIG. 6 is an example of a measurement of the optical output waveform in the semiconductor laser 100 according to the present embodiment. As in the simulation result shown in FIG. 4, the optical output greatly oscillates over time, and it can be confirmed that the self-sustained pulsation occurs. In this semiconductor laser, a stable relative intensity noise (RIN) characteristic of about −135 dB/Hz or less is obtained in a wide temperature range of about 20° C. to about 80° C.

As described above, according to the experiment conducted by the inventors of the present invention, it is difficult, in the case of a red semiconductor laser, to obtain a stable self-sustained pulsation characteristic by simply adding a saturable absorbing layer as done in the conventional techniques. For example, it is difficult to obtain a stable self-sustained pulsation characteristic even when a $Ga_{0.5}In_{0.5}P$ layer having an ordinary doping level is used as the saturable absorbing layer. Particularly, it is difficult to obtain the self-sustained pulsation characteristic at a high temperature.

Moreover, the structure according to the conventional techniques has a tendency that an amount of light consumed in the saturable absorbing layer is large, thereby increasing the threshold current. As a result, the reliability at a high temperature (e.g., 80° C.) may possibly be compromised.

On the contrary, when the saturable absorbing layer is formed by using a material (e.g., InGaAsP) which has a large gradient of the gain characteristic curve as in the present invention, it is possible to obtain a semiconductor laser with a low threshold current which provides a stable operating characteristic even at a temperature as high as about 80° C.

Using the saturable absorbing layer 106 formed of an InGaAsP layer also provides a great advantage in producing the semiconductor laser. That is, the InGaAsP layer in a structure such as that of the semiconductor laser 100 shown in FIG. 1 has, in addition to the function as the saturable absorbing layer 106, a function as an etching stopping layer in an etching process for forming ridges. Specifically, it becomes possible to stop etching at the InGaAsP layer when processing the second p-type cladding layer 105b of AlGaInP into a ridge-like shape by etching it using an etchant such as sulfuric acid.

On the contrary, when GaInP having an ordinary structure is used as the etching stopping layer, only a value as small as about 10 can be obtained as the etching selection ratio between the second p-type cladding layer 105b and the GaInP layer, though it depends upon the etching condition. Therefore, the etching cannot be stopped at the GaInP layer with certainty, and over-etching may occur, whereby there may occur some variation in the operating characteristic of the laser. Moreover, when the etching reaches near the active layer, the reliability may possibly be compromised. On the contrary, when using the InGaAsP layer, which has the function as an etching stopping layer and also the function as a saturable absorbing layer, a value as large as about 20 can be obtained as the etching selection ratio between the second p-type cladding layer and InGaAsP. Thus, it becomes easy to perform the production process of a semiconductor laser.

As described above, using the InGaAsP layer as a saturable absorbing layer provides a great effect both for the operating characteristic of the semiconductor laser and for the production process thereof.

Herein, in the production of a semiconductor laser, after forming a laser structure by growing a layered structure on a substrate, a cavity end face is formed by cleavage. At this point, since an inclined substrate is used as the substrate in the present embodiment, it is necessary to be careful about the direction in which a stress is applied in the cleavage process. This will be described below.

Figure 7:
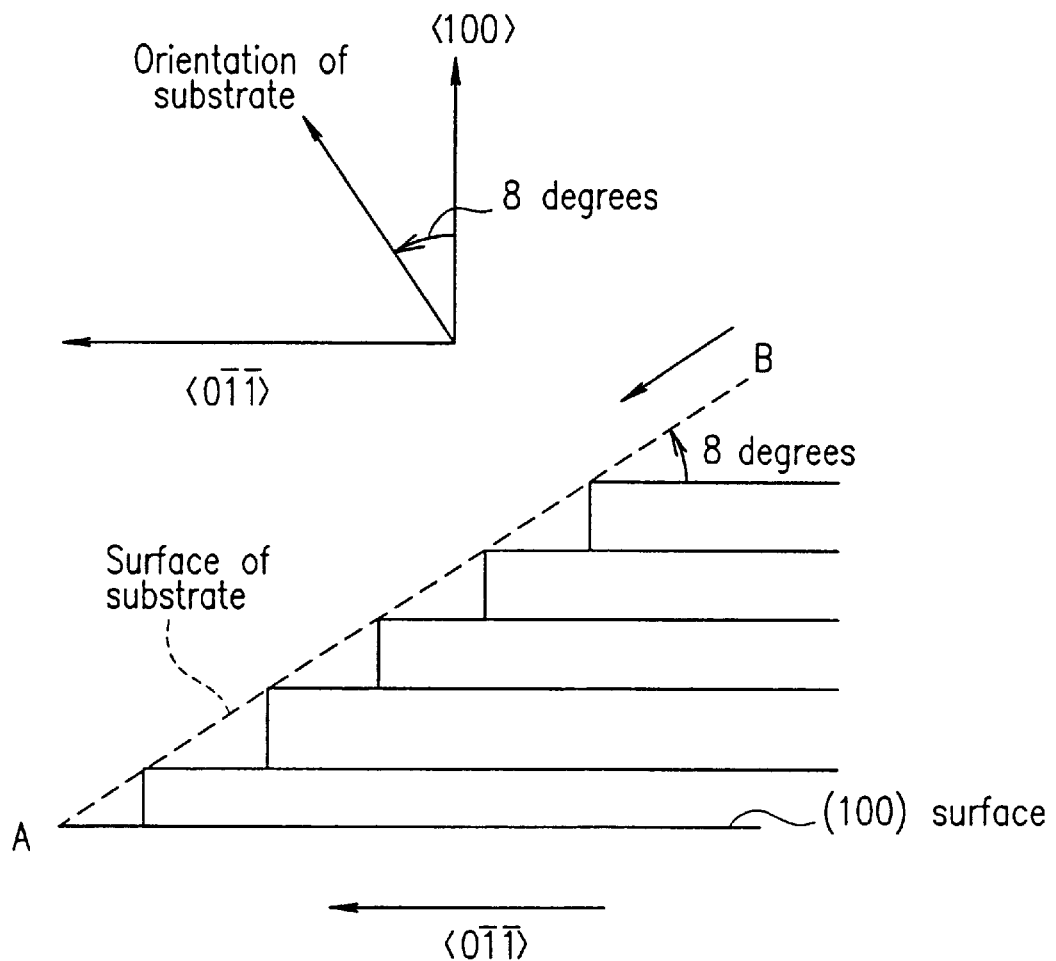
FIG. 7 is a diagram illustrating a relationship between an inclination orientation of the substrate and a preferable cleavage direction.

FIG. 7 is a diagram schematically showing the crystal structure observed on the cavity end face of the semiconductor laser, i.e., the (0-1-1) surface of the GaAs substrate. In the figure, the dotted line represented as "A-B" is the surface of the substrate, and a crystal is grown on this surface. The surface of the substrate appears stepped-wise when viewed at the atomic level, which corresponds to atomic steps.

Herein, as described above, the substrate is inclined by about 8 degrees from the surface orientation of the (100) surface toward the [0-1-1] direction. In view of this, when cleaving the crystal (substrate) in order to obtain chips of the semiconductor lasers 100, a stress is applied from B towards A in FIG. 7. This is because, if a stress is applied in a direction opposite to the above (i.e., from A toward B), the crack of the crystal, which should go from A to B, goes in the direction along the (100) surface during the cleavage process, whereby a reliable cleavage is not realized. Such a circumstance will result in a defect from cleavage and reduce the production yield. Therefore, cleavage is performed from B toward A in the figure.

Such a characteristic relating to the orientation of the cleavage applies not only to the GaAs substrate, but also to any substrate formed of other materials as long as it is an inclined substrate. More generally, the substrate is cleft by applying a stress from a direction (B in the example of FIG. 7), in which a smaller angle is obtained as an angle between the just surface (the (100) surface in the example of FIG. 7) and the surface of the inclined substrate, toward the direction of inclination.

After forming the end face by cleaving the substrate, a coating process is performed on the obtained end face (the cavity end face). Specifically, for example, a predetermined number of pairs of an $SiO_2$ film and an SiN film are deposited by the ECR sputtering method from the side closer to the end face. Herein, the thickness of each of the $SiO_2$ film and the SiN film is set so as to correspond to $\lambda/4$ (where $\lambda$ is the oscillation wavelength).

(Embodiment 2)

Figure 8:
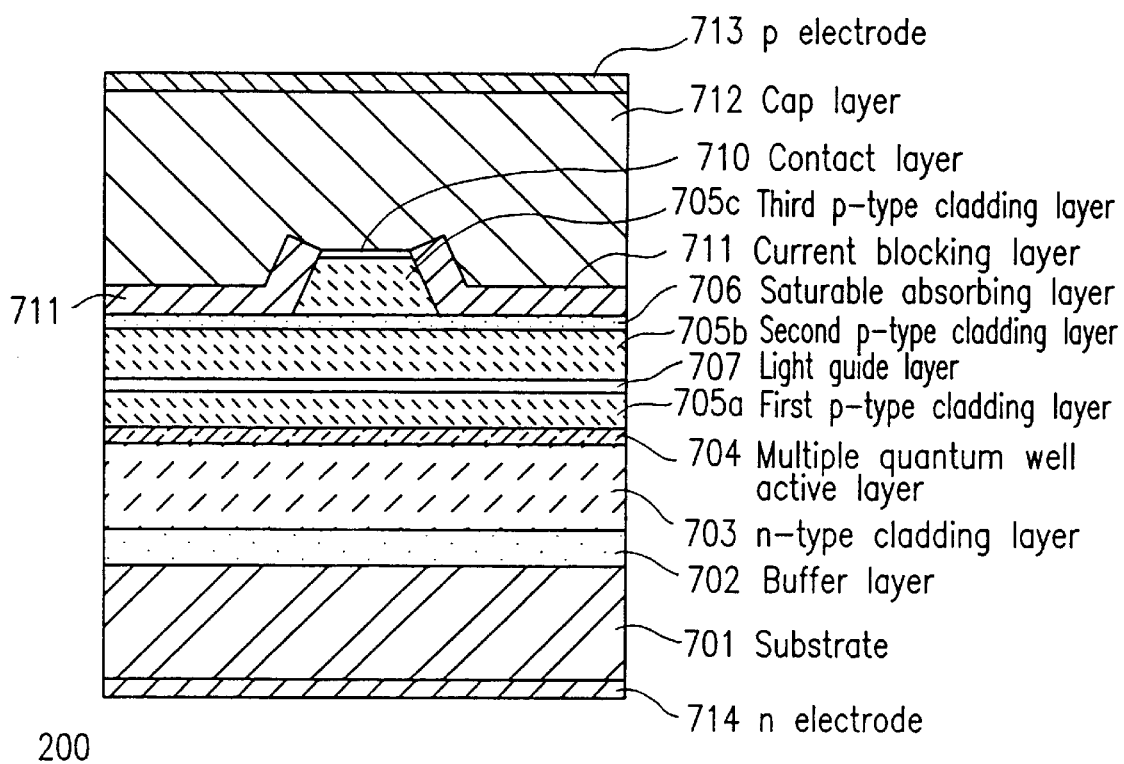
FIG. 8 is a cross-sectional view showing a structure of a semiconductor laser according to Embodiment 2 of the present invention.

FIG. 8 is a cross-sectional view showing a structure of a semiconductor laser 200 having a self-sustained pulsation characteristic according to Embodiment 2 of the present invention.

In the semiconductor laser 200, a buffer layer 702, an n-type AlGaInP cladding layer 703, a multiple quantum well active layer 704 including a GaInP well layer, a first p-type cladding layer 705a of AlGaInP, a p-type light guide layer 707, a second p-type cladding layer 705b of AlGaInP, and an InGaAsP quantum well saturable absorbing layer 706 are sequentially formed on an n-type GaAs substrate 701. A third p-type cladding layer 705c of AlGaInP and a p-type GaInP contact layer 710 are formed on the saturable absorbing layer 706. The third p-type cladding layer 705c and the p-type contact layer 710 are formed into a ridge-like shape, and both sides of the ridge are buried with an n-type GaAs current blocking layer 711. Moreover, a p-type GaAs cap layer 712 is formed on the p-type contact layer 710 and the n-type current blocking layer 711. A p-electrode 713 is formed on the cap layer 712 and, on the other hand, an n-electrode 714 is formed on the reverse surface of the substrate 701.

Figure 9:
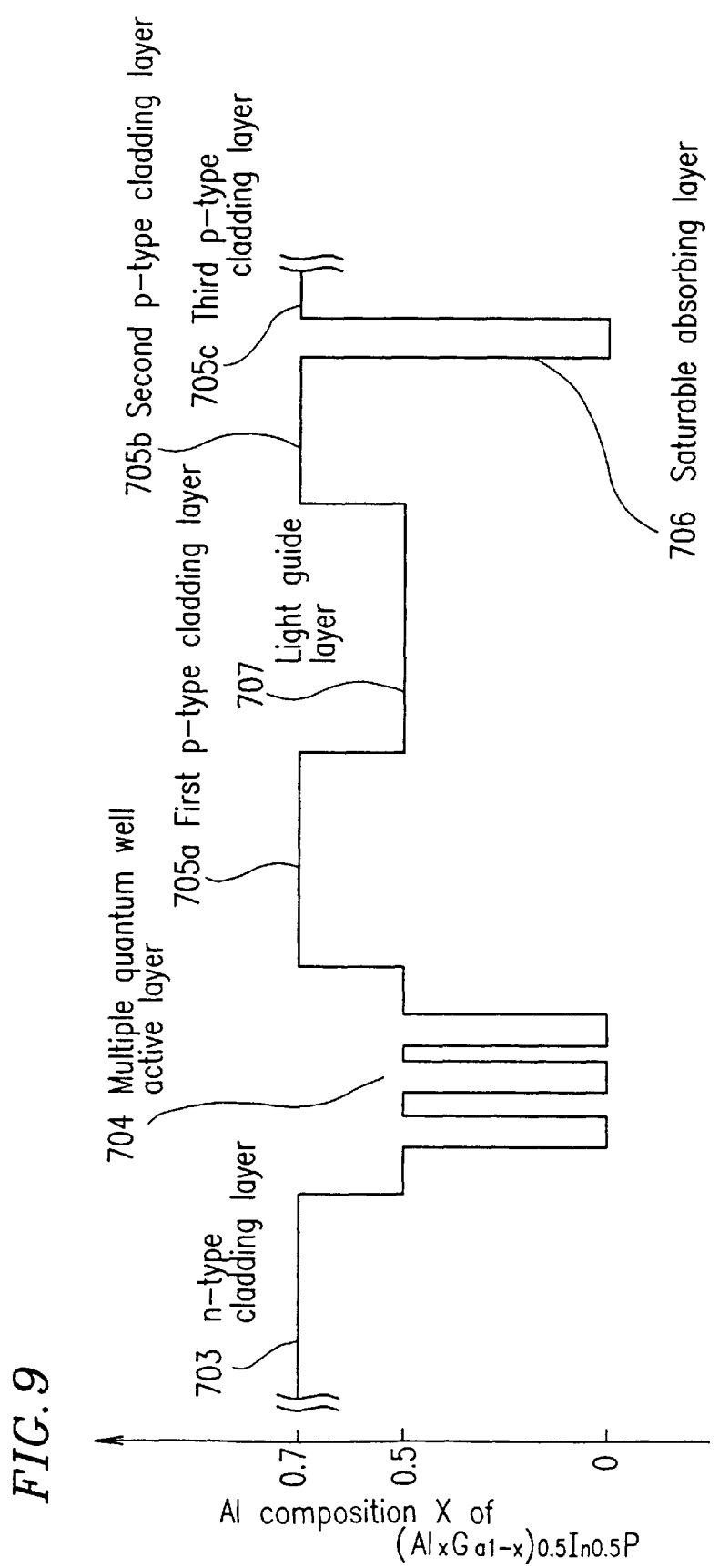
FIG. 9 is a diagram showing variation of an Al composition in, and in the vicinity of, an active layer of the semiconductor laser shown in FIG. 8.

FIG. 9 shows variation of the Al composition x of $(Al_xGa_{1-x})_{0.5}In_{0.5}P$ in and in the vicinity of the active layer 704 of the semiconductor laser 200. As illustrated, in the semiconductor laser 200, the Al compositions x in the n-type cladding layer 703, and in the first, second and third p-type cladding layers 105a, 105b and 105c, are set to 0.7.

In the semiconductor laser 200 of the present embodiment, while the multiple quantum well active layer 704 is used as the active layer 704, a quantum well layer is used as the saturable absorbing layer 706 as well. Herein, the constituent material of the saturable absorbing layer 706 is InGaAsP.

Moreover, in the semiconductor laser 200, the light guide layer 707 is provided in the vicinity of the saturable absorbing layer 706. Herein, the reason for providing the light guide layer 707 is as follows.

When the saturable absorbing layer 706 is a quantum well layer, since the total thickness of the layer is reduced, the light confinement rate (light confinement coefficient) in the saturable absorbing layer 706 is extremely reduced. As a result, light is not sufficiently absorbed in the saturable absorbing layer 706, whereby the saturation of gain does not sufficiently occur. Therefore, as it stands, the self-sustained pulsation does not occur. On the contrary, when the light guide layer 707 as described above is provided, it is possible to increase the light confinement rate (light confinement coefficient) in the saturable absorbing layer 706. Specifically, if the light confinement rate (light confinement coefficient) in the saturable absorbing layer 706 is set to a value of at least about 1.2% or more by providing the light guide layer 707, it becomes possible to cause the self-sustained pulsation.

When the saturable absorbing layer 706 is a quantum well layer, the thickness thereof is thin. Therefore, it is not possible to set the light confinement rate (light confinement coefficient) in the saturable absorbing layer 706 to a magnitude required for realizing the self-sustained pulsation only by the saturable absorbing layer 706 without providing the light guide layer 707. On the other hand, when the number of quantum well layers forming the saturable absorbing layer 706 is increased for the purpose of increasing the light confinement rate (light confinement coefficient), the total volume of the saturable absorbing layer 706 substantially increases, and the carrier concentration decreases, whereby the self-sustained pulsation does not occur.

As revealed by the inventors of the present invention, the self-sustained pulsation was not obtained even when the light confinement rate (light confinement coefficient) in the saturable absorbing layer 706 was increased by increasing the number of layers of the saturable absorbing layer 706. On the contrary, according to the present invention, the self-sustained pulsation was first realized by the combination of two conditions: (1) not to increase the volume of th e saturable absorbing layer 706; and (2) to provide the light guide layer 707.

In the semiconductor laser 200 according to the present embodiment, the multiple quantum well active layer 704 has a quantum well structure having a total thickness of about 50 angstroms, and the number of layers included therein is 3. Moreover, AlGaInP having an Al composition x=0.5 is used as a barrier layer included in the quantum well structure.

On the other hand, AlGaInP having an Al composition X=0.5 is used for the light guide layer 707 associated with the quantum well saturable absorbing layer 706, and the thickness thereof is about 1000 angstroms. In order to realize the intended purpose as the light guide layer 707, the thickness can be of any value as long as it is about 200 Å or more.

Figure 10:
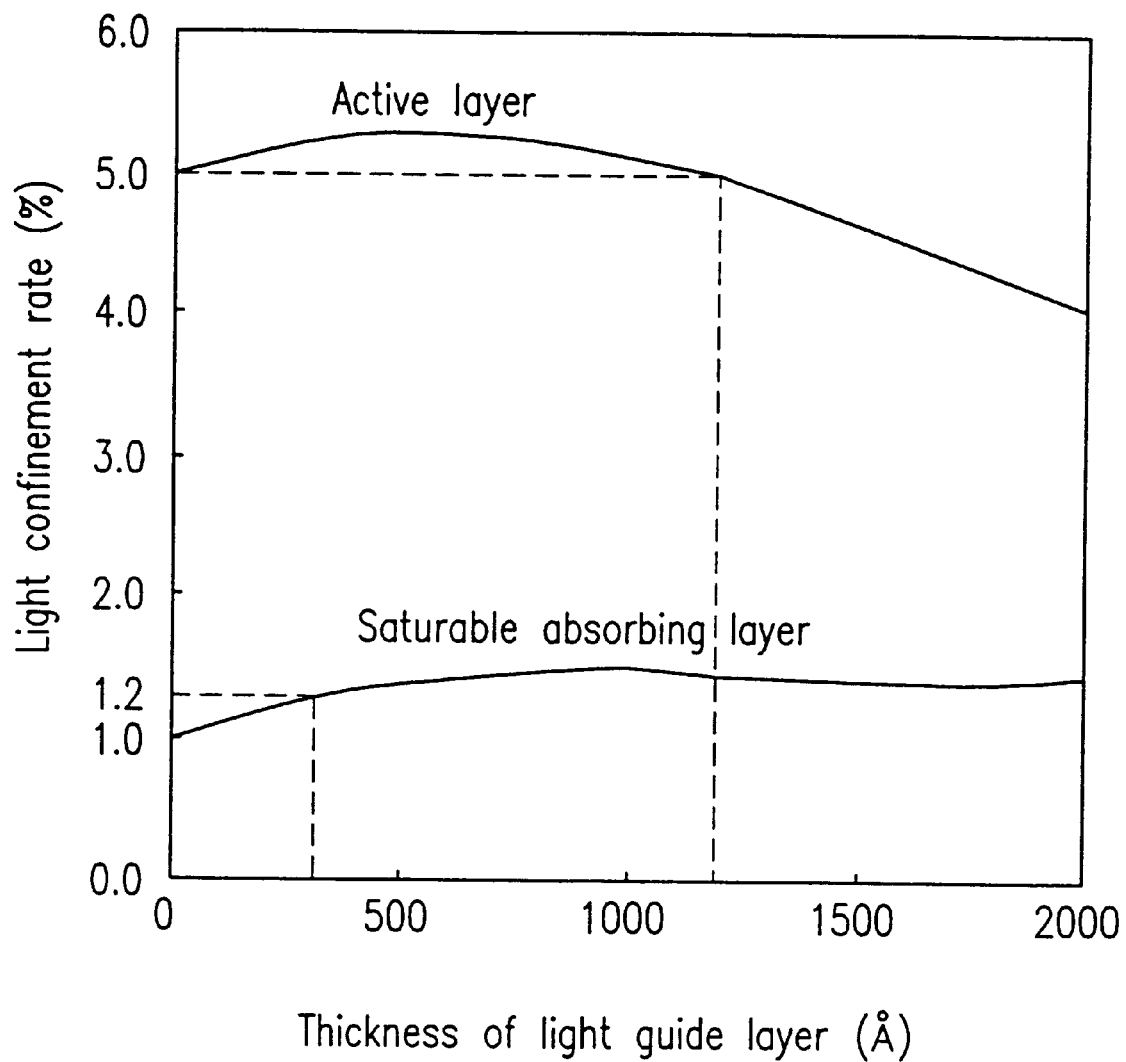
FIG. 10 is a diagram showing a relationship between a light confinement rate (light confinement coefficient) and a thickness of a light guide layer in the semiconductor laser shown in FIG. 8.

Herein, FIG. 10 shows the relationship between the thickness of the light guide layer 707 and the light confinement rate (light confinement coefficient) in the active layer 704 and the saturable absorbing layer 706. From this, if the thickness of the light guide layer 707 is about 300 angstroms or more, the light confinement rate (light confinement coefficient) in the saturable absorbing layer 706 can be set to about 1.2% or more. This makes it possible to cause the self-sustained pulsation with certainty, as described above. On the other hand, when the light guide layer 707 is too thick, the light confinement rate (light confinement coefficient) in the active layer 704 decreases, whereby the threshold current may possibly be increased. The light confinement rate (light confinement coefficient) in the active layer 704 is desirably about 5% or more. In view of this, from FIG. 10, the thickness of the light guide layer 707 is desirably about 1200 Å or less.

Therefore, the thickness of the light guide layer 707 is desirably about 300 angstroms or more but about 1200 angstroms or less.

With a sample of the semiconductor laser 200 actually produced, the self-sustained pulsation occurs in a wide temperature range of about 10° C. to about 80° C. In the above temperature range, a stable relative intensity noise (RIN) characteristic of about −135 dB/Hz or less has been obtained.

As described above, in the present embodiment, the maximum optical output is increased by about 20 percent by introducing the quantum well structure into the active layer 704 of the semiconductor laser 200. Moreover, while reduction of the threshold current and increase of the output are realized, operation at a high temperature is made possible. These are realized by, as described above, using InGaAsP as the constituent material of the saturable absorbing layer 706 and by employing a novel structure of providing the light guide layer 707.

Moreover, it is needless to say that a semiconductor laser having the self-sustained pulsation characteristic can be obtained according to the present invention even in the case where a strained quantum well structure is used for the active layer 704 and the saturable absorbing layer 706 for the purpose of further improving the operating characteristic.

(Embodiment 3)

Figure 11:
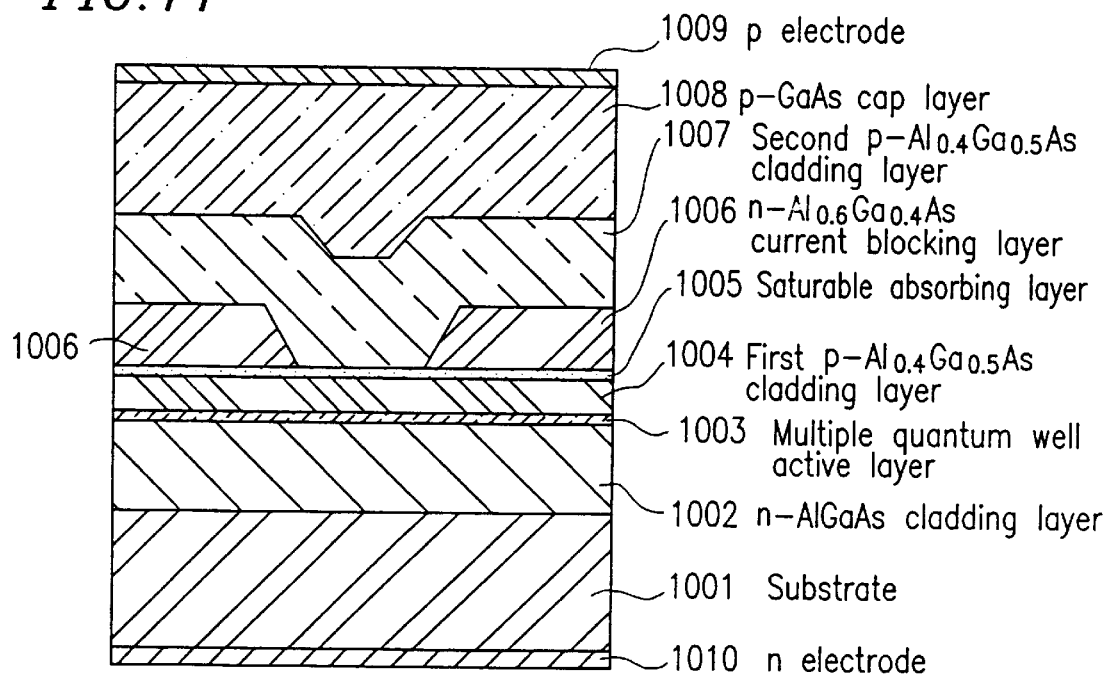
FIG. 11 is a cross-sectional view showing a structure of a semiconductor laser according to Embodiment 3 of the present invention.

FIG. 11 is a cross-sectional view showing a structure of a semiconductor laser 300 having a self-sustained pulsation characteristic according to Embodiment 3 of the present invention.

In the semiconductor laser 300, an n-type AlGaAs cladding layer 1002, a multiple quantum well active layer 1003 including a GaAs well layer, a first p-type cladding layer 1004 of AlGaInP, and an InGaAs quantum well saturable absorbing layer 1005 are sequentially formed on an n-type GaAs substrate 1001. An n-type AlGaAs current blocking layer 1006 having a striped opening is formed on the saturable absorbing layer 1005. Moreover, a second p-type cladding layer 1007 of AlGaAs is formed on the saturable absorbing layer 1005 and the current blocking layer 1006, and a p-type GaAs cap layer 1008 is formed thereon. A p-electrode 1009 is formed on the cap layer 1008 and, on the other hand, an n-electrode 1010 is formed on the reverse surface of the substrate 1001.

Typical thicknesses of the above layers are as follows.

TABLE 2

| Name | Reference numeral | Thickness |
|---|---|---|
| Cap layer | 1008 | 3 μm |
| Second p-type | 1007 | 0.9 μm |

TABLE 2-continued

| Name | Reference numeral | Thickness |
|---|---|---|
| cladding layer | | |
| Current blocking layer | 1006 | 0.6 μm |
| Saturable absorbing layer | 1005 | 50 Å |
| First p-type cladding layer | 1004 | 0.15 μm |
| Multiple quantum well active layer | 1003 | 300 Å |
| N-type cladding layer | 1002 | 1.0 μm |

In the above, for the multi quantum well active layer 1003, the total thickness thereof is shown.

As shown in Table 2, in the semiconductor laser 300, the thickness of the saturable absorbing layer 1005 is set to about 50 Å. When the saturable absorbing layer 1005 is thick, the volume thereof becomes too large, whereby it is difficult for the carrier concentration to be large. Therefore, it becomes difficult for the variation of the carrier concentration, i.e., an intense oscillation of the carrier, to occur in the saturable absorbing layer 1005, whereby it becomes difficult to obtain the self-sustained pulsation characteristic. Thus, it is desirable for the saturable absorbing layer 1005 to be thin.

The composition of the InGaAs saturable absorbing layer 1005 is, for example, $In_{0.2}Ga_{0.8}As$. The lattice constant of InGaAs having this composition is larger than the lattice constant of GaAs forming the substrate 1001 and, as a result, a compressive stress is applied to the saturable absorbing layer 1005. Thus, the saturable absorbing layer 1005 of the semiconductor laser 300 has a strained quantum well structure.

Figure 12:
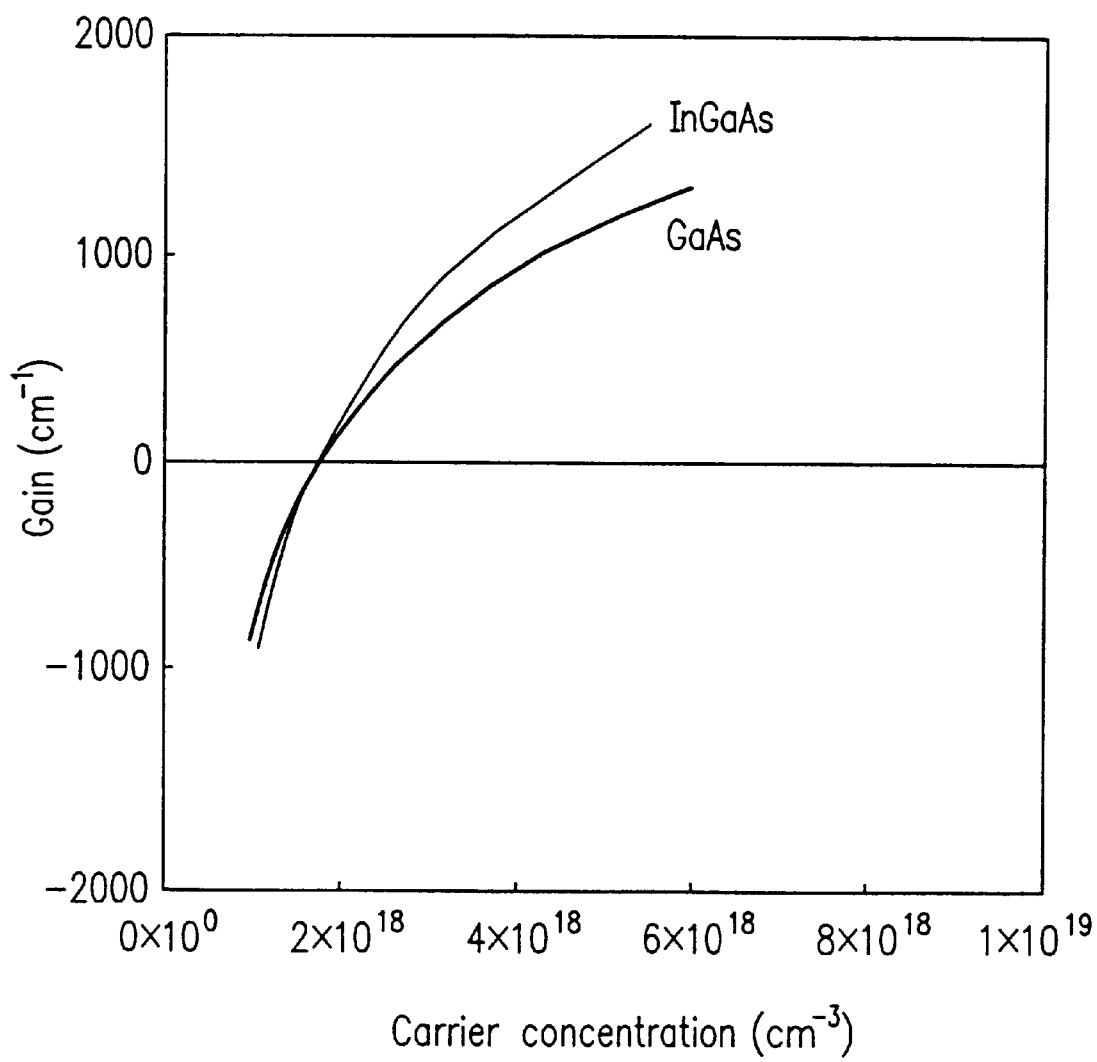
FIG. 12 is a diagram showing gain characteristic curves of GaAs and InGaAs.

FIG. 12 shows the gain characteristics (relationship between the carrier concentration and the gain) of GaAs and InGaAs. As can be seen therefrom, InGaAs has a larger gradient of the gain characteristic curve.

As described above, the study made by the inventors of the present invention has revealed that, in a semiconductor laser having a saturable absorbing layer, the self-sustained pulsation characteristic can more easily be obtained as the gradient (the ratio of the variation of the gain with respect to the variation of the carrier concentration) of the gain characteristic of the material used for the saturable absorbing layer. In other words, as the gradient of the gain characteristic curve is larger, it is more advantageous for the self-sustained pulsation. This can be explained as follows. In order to obtain the self-sustained pulsation characteristic, an intense oscillation of the carrier within the saturable absorbing layer is required. Herein, as the gradient of the gain characteristic curve becomes larger, the carrier concentration can be varied by a smaller amount of light absorption. As a result, as the gradient of the gain characteristic curve is larger, the oscillation of the carrier occurs more easily and the self-sustained pulsation phenomenon occurs more easily.

With a sample of the semiconductor laser 300 actually produced, the self-sustained pulsation occurs in a wide temperature range of about 10° C. to about 100° C. In the above temperature range, a stable relative intensity noise (RIN) characteristic of about −135 dB/Hz or less has been obtained.

As described above, in the present embodiment, by using a novel material of InGaAs as the constituent material of the saturable absorbing layer 1005, the threshold current is reduced and operation at a high temperature becomes achievable, as compared to the case where the saturable absorbing layer is formed of other materials such as GaAs. Herein, although the saturable absorbing layer of InGaAs has been described as an example in the above description, similar effects as above can be obtained also by forming the saturable absorbing layer using InGaAsP.

(Embodiment 4)

Figure 13:
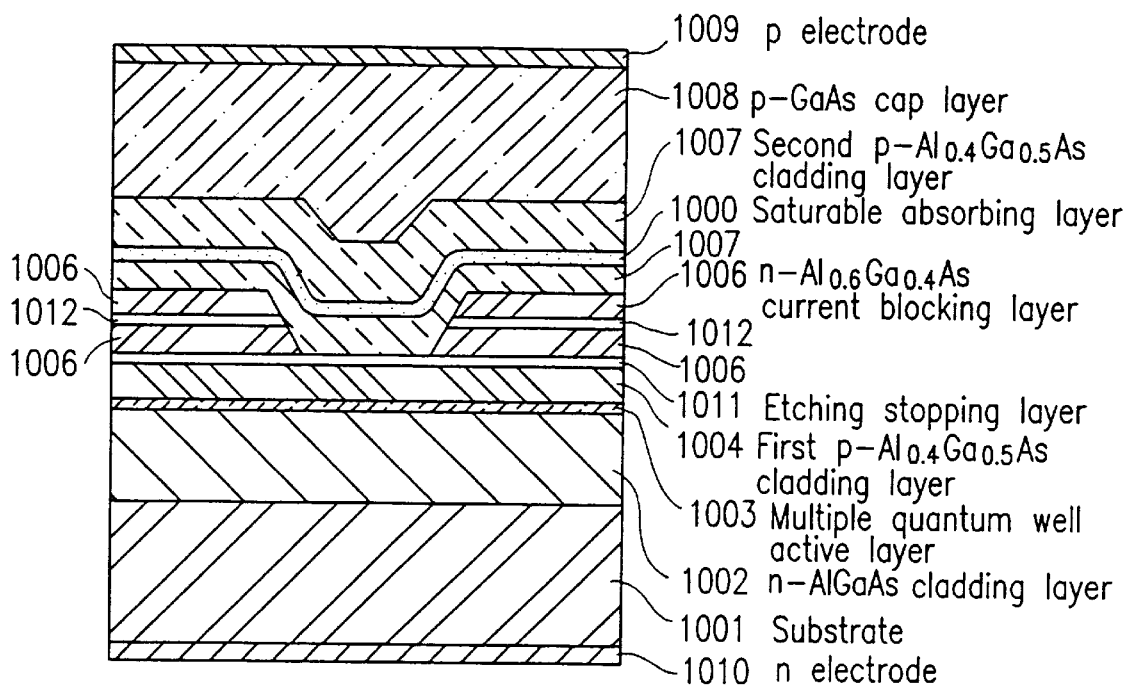
FIG. 13 is a cross-sectional view showing a structure of a semiconductor laser according to Embodiment 4 of the present invention.

FIG. 13 is a cross-sectional view showing a structure of a semiconductor laser 400 having a self-sustained pulsation characteristic according to Embodiment 4 of the present invention.

The structure of the semiconductor laser 400 is similar to the structure of the semiconductor laser 300, which has been described with reference to FIG. 11. The same reference numerals are used for the corresponding components, and description therefor will be omitted below.

The structure of the semiconductor laser 400 differs from the structure of the semiconductor laser 300 in that a saturable absorbing layer 1000 is provided in the second p-type cladding layer 1007; a mode control layer 1012 is provided in the current blocking layer 1006; and an etching stopping layer 1011 is provided for the purpose of controlling the etching for forming an opening in the current blocking layer 1006.

The etching stopping layer 1011 is a thin layer, and there is little light absorption by the layer 1011. Therefore, light generated in the active layer 1003 spreads into the second p-type cladding layer 1007 with little portion thereof being absorbed by the etching stopping layer 1011, and is absorbed by the saturable absorbing layer 1000 formed in the second p-type cladding layer 1007. This light absorption by the saturable absorbing layer 1000 is saturated, after which a gain is provided. As a result, oscillation of the carrier occurs, and the self-sustained pulsation characteristic is provided.

In the structure of the semiconductor laser 400 as described above, for example, the Al composition of AlGaAs forming the current blocking layer 1006 is set to 0.6, while setting the Al composition of AlGaAs forming the first cladding layer 1004 and the second cladding layer 1007 is set to 0.4, whereby the effective refractive index of a region of the active layer 1003 directly below the opening of the current blocking layer 1006 is higher than the effective refractive index of the regions on both sides thereof (i.e., regions of the active layer 1003 which are covered with the current blocking layer 1006). Therefore, it is possible to obtain a real refractive index-guided laser structure, whereby a semi-conductor laser having a high output and a low threshold current characteristic can be realized.

Moreover, in the semiconductor laser 400 of the present embodiment, the mode control layer 1012 is provided in the current blocking layer 1006. The mode control layer 1012 is provided for the purpose of preventing an electric field of light from existing only under the current blocking layer 1006 and not existing under the opening when the amount of light absorbed by the saturable absorbing layer 1000 is large. When the mode control layer 1012 is provided, light is absorbed also by the layer 1012. Therefore, light may exist also under the opening of the current blocking layer 1006, thereby consequently realizing transverse mode oscillation.

As described above, in the present embodiment, the threshold current of the semiconductor laser is reduced by employing the real refractive index-guided laser structure. Moreover, under a low-output condition, the self-sustained pulsation characteristic can be obtained while achieving an increase of the output. Furthermore, by providing the mode control layer 1012 in the current blocking layer 1006, it is possible to prevent the mode of light from being separated directly under the opening of the current blocking layer 1006.

(Embodiment 5)

Figure 14:
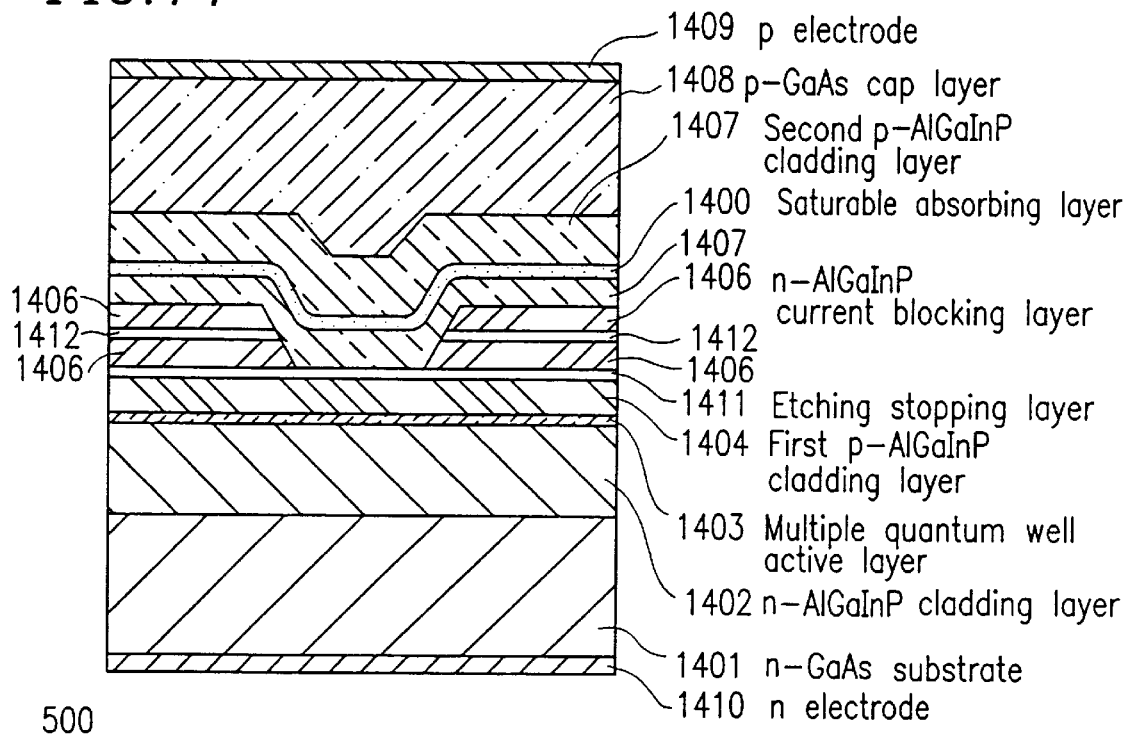
FIG. 14 is a cross-sectional view showing a structure of a semiconductor laser according to Embodiment 5 of the present invention.

FIG. 14 is a cross-sectional view showing a structure of an AlGaInP type red semiconductor laser 500 as Embodiment 5 of the present invention.

The structure and function of the semiconductor laser 500 are approximately the same as those of the semiconductor laser 400 of Embodiment 4, which has been described with reference to FIG. 13. The difference therebetween is that AlGaInP is used as a constituent material in the semiconductor laser 500 of the present embodiment. In the structure of the semiconductor laser 500 (FIG. 14), each of the components which corresponds to one of the components (the substrate and layers) included in the structure of the semiconductor laser 400 (FIG. 13) is provided with a reference numeral of a value obtained by adding "400" to the reference numeral of the semiconductor laser 400 (FIG. 13). For example, a substrate 1401 included in the semiconductor laser 500 shown in FIG. 14 corresponds to the substrate 1001 included in the semiconductor laser 400 shown in FIG. 13. Thus, detailed description for the structure of the semiconductor laser 500 will be omitted.

In the multiple quantum well structure of an active layer 1403 of the semiconductor laser 500, the composition of the well layer is $Ga_{0.5}In_{0.5}P$, and the composition of the barrier layer is $(Al_{0.7}Ga_{0.3})_{0.5}In_{0.5}P$. Moreover, the composition of each of an n-type cladding layer 1402, a first p-type cladding layer 1404 and a second p-type cladding layer 1407 is $(Al_{0.7}Ga_{0.3})_{0.5}In_{0.5}P$. Furthermore, the composition of each of a current blocking layer 1406, a saturable absorbing layer 1400 and a mode control layer 1412 is $(Al_{0.5}Ga_{0.5})_{0.5}In_{0.5}P$. Herein, the saturable absorbing layer 1400 and the mode control layer 1412 may be $In_{0.2}Ga_{0.8}As$.

The semiconductor laser 500 of the present embodiment having such a structure has similar effects as those of the semiconductor laser 400 of Embodiment 4. Herein, the oscillation wavelength is in the red region, that is about 660 nm.

Although the composition of the first p-type cladding layer 1404 is $(Al_{0.7}Ga_{0.3})_{0.5}In_{0.5}P$ in the above description, an (AlGa)InPN layer having a bandgap larger than that of the above $(Al_{0.7}Ga_{0.3})_{0.5}In_{0.5}P$ layer may also be used in view of preventing electrons from overflowing during a high temperature operation. This (AlGa)InPN layer can be grown by flowing an $NH_3$ gas at a temperature of about 900° C. Moreover, when growing the (AlGa)InPN layer, it can be grown as a layer having a lattice constant which is identical to the lattice constant of the GaAs substrate by increasing the amount of In (indium) element, which has a large atomic radius, by an amount of introduced N (nitrogen) element, which has a small atomic radius. The specific composition is, for example, $(Al_{0.7}Ga_{0.3})_{0.4}In_{0.6}P_{0.9}N_{0.1}$. Thus, by using the (AlGa)InPN layer as the first p-type cladding layer 1404, it is possible to prevent electrons from overflowing even during a high temperature operation, thus improving the temperature characteristic of the semiconductor laser.

Moreover, when using the (AlGa)InPN layer, it is possible to realize selective etching between the AlGaInP layer and the (AlGa)InPN layer, whereby it is not necessary to additionally provide the etching stopping layer, thus simplifying the production process.

Industrial Applicability

As described above, in the semiconductor laser of the present invention, by providing a saturable absorbing layer of InGaAsP (herein, the composition thereof can be expressed as $In_xGa_{1-x}As_yP_{1-y}$ (0<x<1, 0≦y≦1)), it is possible to make the gradient of the gain characteristic curve (the ratio of the variation of the gain with respect to the carrier concentration) larger as compared to the case of using a saturable absorbing layer of GaInP. This makes it possible to vary the carrier concentration by a smaller amount of light absorption, whereby the oscillation of the carrier can occur more easily. At the same time, it becomes possible to reduce the energy gap of the saturable absorbing layer to be smaller than the energy gap of the active layer by about 30 meV to about 200 meV. As a result, it becomes possible to easily obtain a stable self-sustained pulsation characteristic while the relative noise can be reduced.

Moreover, in the semiconductor laser of the present invention, it is possible to easily generate an increase in the carrier concentration by the light absorption by setting the thickness of the saturable absorbing layer to be about 100 angstroms or less. Thus, the oscillation of the carrier can occur more easily, whereby it is possible to easily obtain a stable self-sustained pulsation characteristic.

Furthermore, in the semiconductor laser of the present invention, it is possible to provide a semiconductor laser which has a self-sustained pulsation characteristic in a low output region while being able to realize a higher output at the same time, by providing a saturable absorbing layer in the cladding layer located above the opening of the current blocking layer while providing a laser structure of the real refractive index-guided type. Furthermore, it is possible to prevent the mode separation of laser light at the opening of the current blocking layer by providing a mode control layer in the current blocking layer.

What is claimed is:

1. A semiconductor laser comprising an active layer and a cladding structure interposing the active layer, wherein the cladding structure includes a saturable absorbing layers and the saturable absorbing layer is formed of $In_xGa_{1-x}As_yP_{1-y}$ ($0<x<1$, $0\leq y\leq 1$), wherein an interval between the saturable absorbing layer and the active layer is about 200 angstroms or more.

2. A semiconductor laser according to claim 1, wherein the cladding structure further includes a light guide layer, and the saturable absorbing layer is adjacent to the light guide layer.

3. A semiconductor laser according to claim 1, wherein the cladding structure further includes a light guide layer, and the saturable absorbing layer is located in a vicinity of the light guide layer.

4. A semiconductor laser according to claim 1, wherein the saturable absorbing layer has a strained quantum well structure, and an energy gap between ground states of the saturable absorbing layer is smaller than an energy gap of the active layer by about 30 meV to about 200 meV.

5. A semiconductor laser according to claim 1, wherein the active layer and the cladding structure excluding the saturable absorbing layer are formed of $(Al_xGa_{1-x})_yIn_{1-y}P$.

6. A semiconductor laser comprising an active layer and a cladding structure interposing the active layer, wherein:

the cladding structure includes a saturable absorbing layer; the saturable absorbing layer is formed of InGaAsP; and the saturable absorbing layer has a strained quantum well structure, wherein an interval between the saturable absorbing layer and the active layer is about 200 angstroms or more.

7. A semiconductor laser according to claim 6, wherein the cladding structure further includes a light guide layer, and the saturable absorbing layer is adjacent to the light guide layer.

8. A semiconductor laser according to claim 6, wherein the cladding structure further includes a light guide layer, and the saturable absorbing layer is located in a vicinity of the light guide layer.

9. A semiconductor laser according to claim 6, wherein an energy gap between ground states of the saturable absorbing layer is smaller than an energy gap of the active layer by about 30 meV to about 200 meV.

10. A semiconductor laser according to claim 6, wherein the active layer and the cladding structure excluding the saturable absorbing layer are formed of $(Al_xGa_{1-x})_yIn_{1-y}P$.

11. A semiconductor laser comprising an active layer and a cladding structure interposing the active layer, wherein the cladding structure includes a saturable absorbing layer, and the saturable absorbing layer is formed of InGaAs, wherein an interval between the saturable absorbing layer and the active layer is about 200 angstroms or more.

12. A semiconductor laser according to claim 11, wherein the cladding structure further includes a light guide layer, and the saturable absorbing layer is adjacent to the light guide layer.

13. A semiconductor laser according to claim 11, wherein the cladding structure further includes a light guide layer, and the saturable absorbing layer is located in a vicinity of the light guide layer.

14. A semiconductor laser according to claim 11, wherein the saturable absorbing layer has a strained quantum well structure, and an energy gap between ground states of the saturable absorbing layer is smaller than an energy gap of the active layer by about 30 meV to about 200 meV.

15. A semiconductor laser according to claim 11, wherein the active layer and the cladding structure excluding the saturable absorbing layer are formed of $Al_zGa_{1-z}As$.

16. A semiconductor laser comprising an active layer and a cladding structure interposing the active layer, wherein the cladding structure includes a saturable absorbing layer, and a thickness of the saturable absorbing layer is about 100 angstroms or less.

17. A semiconductor laser according to claim 16, wherein the thickness of the saturable absorbing layer is about 80 angstroms or less.

18. A semiconductor laser according to claim 16, wherein the cladding structure further includes a light guide layer, and the saturable absorbing layer is adjacent to the light guide layer, the light guide layer having a thickness of at least 300 angstroms and no more than 1200 angstroms.

19. A semiconductor laser according to claim 16, wherein the cladding structure further includes a light guide layer, and the saturable absorbing layer is located in a vicinity of the light guide layer.

20. A semiconductor laser according to claim 16, wherein the saturable absorbing layer has a strained quantum well structure, and an energy gap between ground states of the saturable absorbing layer is smaller than an energy gap of the active layer by about 30 meV to about 200 meV.

21. A semiconductor laser comprising:

an active layer;

an n-type cladding layer and a first p-type cladding layer interposing the active layer;

a saturable absorbing layer formed on the first p-type cladding layer;

a current blocking layer formed on the saturable absorbing layer, the current blocking layer having an opening therethrough, the opening forming a groove; and a second p-type cladding layer formed on the current blocking layer and within the groove, where by the second p-type cladding layer includes the saturable absorbing layer.

22. A semiconductor laser according to claim 21, wherein the saturable absorbing laser is formed of InGaAsP or InGaAs.

23. A semiconductor laser according to claim 21, wherein a mode control layer is formed in the current blocking layer preventing a mode of light being separated under the opening of the current blocking layer.

24. A semiconductor laser according to claim 21, wherein the first p-type cladding layer is formed of a material which has a bandgap larger than a bandgap of the n-type cladding layer.

25. A semiconductor laser according to claim 24, wherein the first p-type cladding layer is an AlGaInPN layer.

* * * * *